(12) United States Patent
Cheng et al.

(10) Patent No.: US 10,755,963 B2
(45) Date of Patent: Aug. 25, 2020

(54) CROSSBAR REINFORCED SEMICONDUCTOR FINS HAVING REDUCED WIGGLING

(71) Applicant: International Business Machines Corporation, Armonk, NY (US)

(72) Inventors: Kangguo Cheng, Schenectady, NY (US); Chi-Chun Liu, Altamont, NY (US); Yann Mignot, Slingerlands, NY (US); Muthumanickam Sankarapandian, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 100 days.

(21) Appl. No.: 16/170,358

(22) Filed: Oct. 25, 2018

(65) Prior Publication Data

US 2020/0135539 A1 Apr. 30, 2020

(51) Int. Cl.
*H01L 21/762* (2006.01)
*H01L 29/66* (2006.01)
(Continued)

(52) U.S. Cl.
CPC .. *H01L 21/76208* (2013.01); *H01L 21/26506* (2013.01); *H01L 21/76224* (2013.01); *H01L 29/66666* (2013.01); *H01L 29/66795* (2013.01); *H01L 21/02118* (2013.01); *H01L 21/02238* (2013.01); *H01L 21/02255* (2013.01); *H01L 21/02318* (2013.01); *H01L 21/30604* (2013.01);
(Continued)

(58) Field of Classification Search
CPC ........ H01L 21/76208; H01L 21/26506; H01L 21/76224
See application file for complete search history.

(56) References Cited

U.S. PATENT DOCUMENTS 8,268,727 B2  9/2012 Johnson et al.
8,741,714 B2  6/2014 Lee
(Continued)

FOREIGN PATENT DOCUMENTS

CN    107644816 A    1/2018
WO    2018/063277 A1  4/2018

OTHER PUBLICATIONS

Cheng et al.; "Bottom Oxidation through STI (BOTS)—A Novel Approach to Fabricate Dielectric Isolated FinFET on Bulk Substrates"; VLSI Conference Paper, Jun. 2014; 3 pages.
(Continued)

*Primary Examiner* — Douglas M Menz
(74) *Attorney, Agent, or Firm* — Cantor Colburn LLP; Vazken Alexanian

(57) ABSTRACT

A method for forming a silicon structure. A non-limiting example of the method includes forming at least two semiconductor fins on a substrate. A polymer brush material is formed over the fins and the substrate. A block copolymer (BCP) composed of a first polymer and a second polymer which are covalently bound together is applied over the polymer brush material, such that the first polymer and second polymer self-assemble into a plurality of interleaved first microdomains and second microdomains perpendicular to and within a trench between the fins. The first microdomains are composed of the first polymer and the second microdomains are composed of the second polymer. The second microdomains can be selectively removed.

14 Claims, 16 Drawing Sheets

(51) Int. Cl.
*H01L 21/265* (2006.01)
*H01L 21/02* (2006.01)
*H01L 21/306* (2006.01)
*H01L 21/311* (2006.01)

(52) U.S. Cl.
CPC .... *H01L 21/31111* (2013.01); *H01L 21/31138* (2013.01); *H01L 21/31144* (2013.01)

(56) References Cited

U.S. PATENT DOCUMENTS

| | | |
|---|---|---|
| 9,496,397 B2 | 11/2016 | Ching et al. |
| 9,530,868 B2 | 12/2016 | Huang et al. |
| 9,685,507 B2 | 6/2017 | Basker et al. |
| 2006/0177977 A1 | 8/2006 | Chan et al. |
| 2010/0267238 A1 | 10/2010 | Johnson et al. |
| 2014/0091381 A1 | 4/2014 | Lee |
| 2015/0054039 A1 | 2/2015 | Ching et al. |
| 2016/0056045 A1 | 2/2016 | Huang et al. |
| 2018/0090567 A1 | 3/2018 | Basker et al. |

OTHER PUBLICATIONS

Han et al.; "Graphoepitaxial Assembly of Symmetric Block Copolymers on Weakly Preferential Substrates"; Advanced Materials (2010); 5 pages.

Mansky et al.; "Controlling Polymer-Surface Interactions with Random Copolymer Brushes"; Science 275 (1997); 4 pages.

Tanaka et al.; "Mechanism of Resist Pattern Collapse during Development Process"; Japan J. Applied Physics Vo. 32 (1993); 6 pages.

A - A

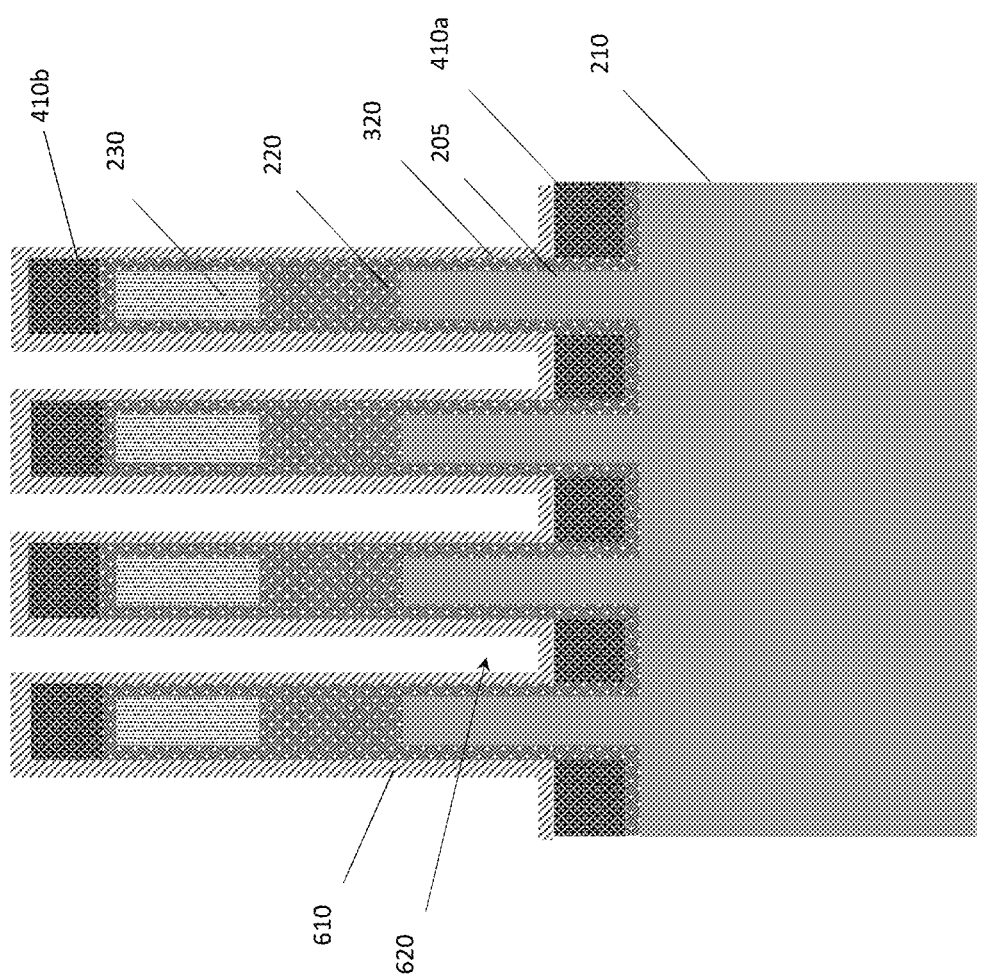

A - A

A - A

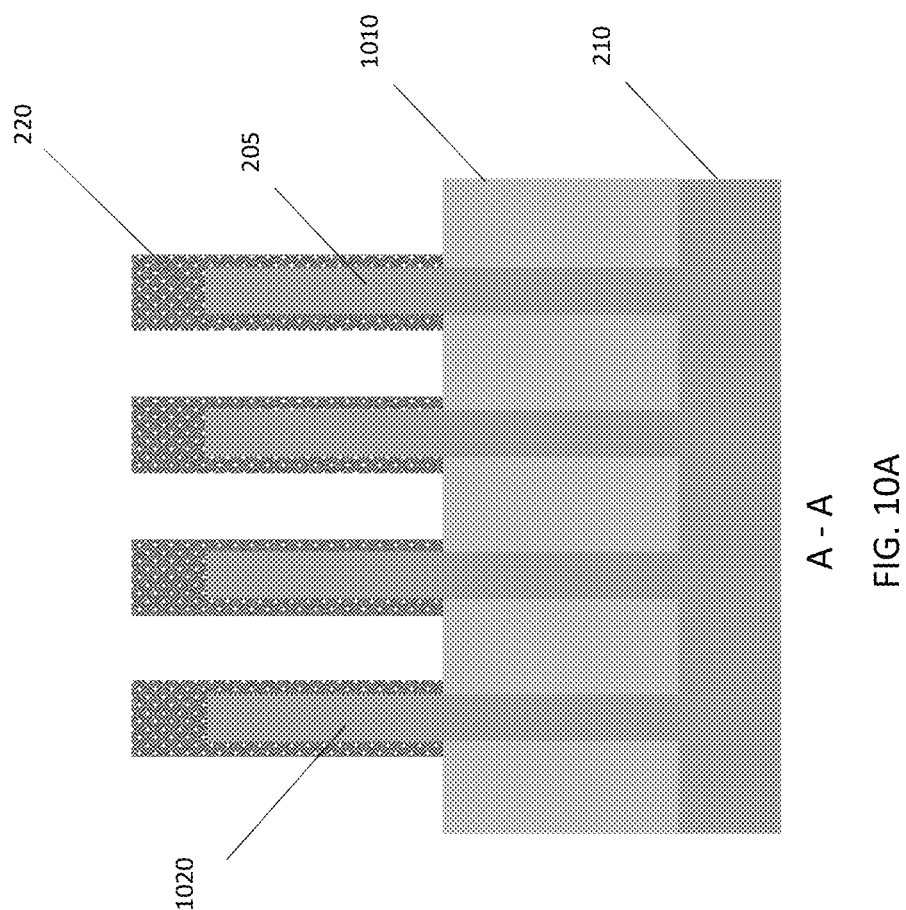

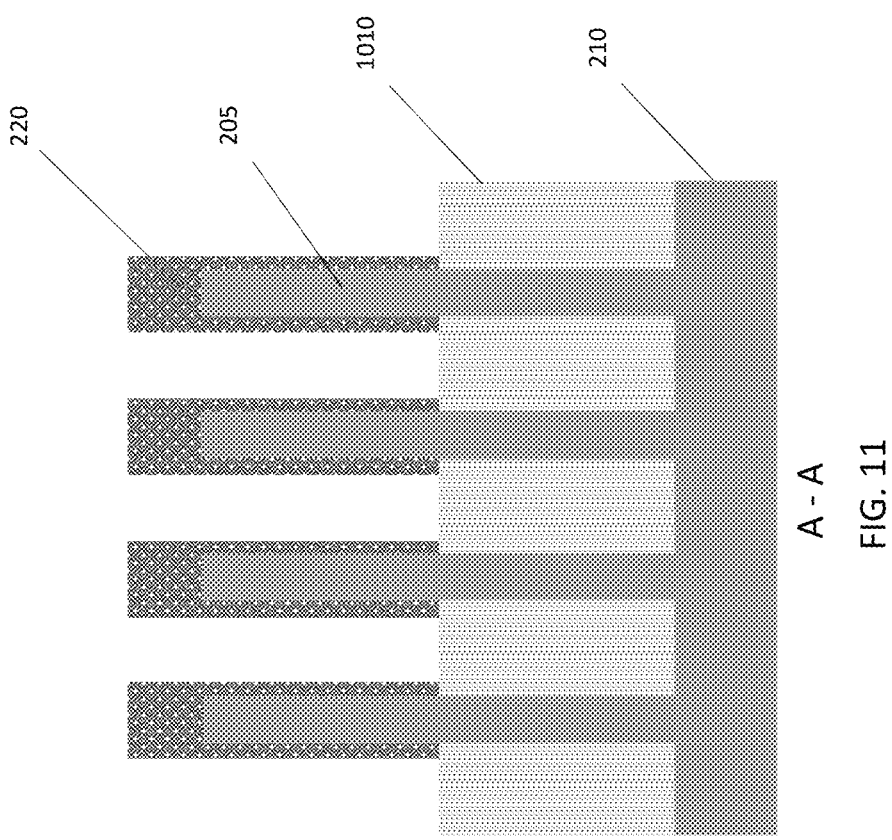

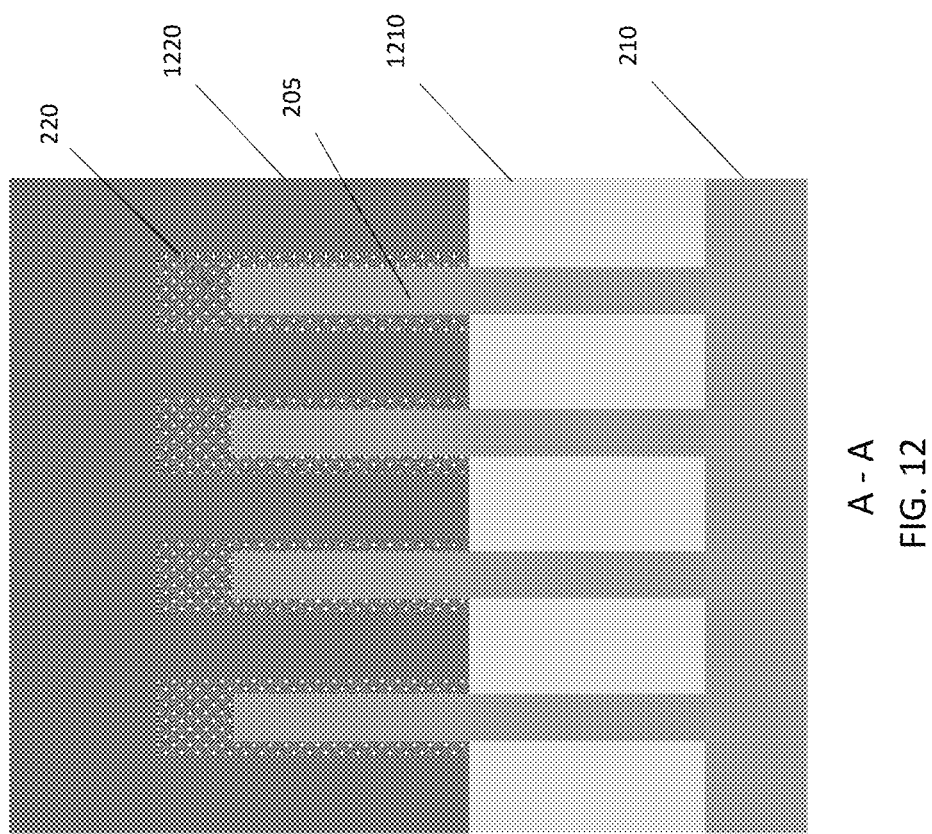

US 10,755,963 B2

CROSSBAR REINFORCED SEMICONDUCTOR FINS HAVING REDUCED WIGGLING

BACKGROUND

The present invention generally relates to semiconductor processing, and more specifically, to fabrication methods and resulting structures for crossbar reinforced semiconductor fins having reduce wiggling.

Typical semiconductor devices are formed using active regions of a wafer. The active regions are defined by isolation regions used to separate and electrically isolate adjacent semiconductor devices. For example, in an integrated circuit (IC) having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. The channel region connects the source and the drain. Electrical current is induced to flow through the channel region from the source to the drain by a voltage applied at the gate electrode.

So-called "nonplanar" MOSFETs have been developed as a means to reduce the footprint of planar MOSFET architectures by providing certain transistor elements (e.g., channel, source, drain, gate, etc.) as substantially nonplanar three-dimensional (3D) structures. Many nonplanar MOSFET architectures form one or more portions of the transistor (e.g., channel, source, drain, gate, etc.) as a fin-shaped structure. In order to decrease the center-to-center distance (or pitch) between a given feature (e.g., gate) of adjacent transistors and increase device density on the wafer, the aspect ratios of these fin-shaped structures are often high. In other words, each fin-shaped structure in a given nonplanar MOSFET is much taller than it is wide

SUMMARY

Embodiments of the present invention are directed to a method for forming a silicon structure. A non-limiting example of the method includes forming at least two semiconductor fins on a substrate. A polymer brush material is formed over the fins and the substrate. A block copolymer (BCP) composed of a first polymer and a second polymer which are covalently bound together is applied over the polymer brush material, such that the first polymer and second polymer self-assemble into a plurality of interleaved first microdomains and second microdomains perpendicular to and within a trench between the fins. The first microdomains are composed of the first polymer and the second microdomains are composed of the second polymer. The second microdomains can be selectively removed.

Embodiments of the invention are directed to a semiconductor structure. The structure includes a substrate and semiconductor fins on the substrate. There are trenches between the fins. The structure has spaced apart silicon crossbars within the trenches between the fins and perpendicular to the fins.

Embodiments of the invention are directed to a method for forming a silicon structure. A non-limiting example of the method includes forming at least two semiconductor fins on a substrate. A monolayer of polymer brush material is formed over the fins and the substrate. A block copolymer including a first polymer and a second polymer is formed in between the fins, such that the first polymer and second polymer self-assemble into a plurality of interleaved first microdomains and second microdomains perpendicular to and within a trench between the fins, the first microdomains including the first polymer and the second microdomains including the second polymer. The second microdomains are removed. The polymer brush is greater than 47% and less than 78% of styrene content and the block copolymer is lamella-forming with about 50% of polystyrene.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 6 depicts a cross-sectional view of a semiconductor structure after a processing operation according to one or more embodiments of the present invention;

FIG. 10A depicts a cross-sectional view of a semiconductor structure after a processing operation according to one or more embodiments of the present invention;

FIG. 11 depicts a cross-sectional view of a semiconductor structure after a processing operation according to one or more embodiments of the present invention; and FIG. 12 depicts a cross-sectional view of a semiconductor structure after a processing operation according to one or more embodiments of the present invention.

Figure 1:
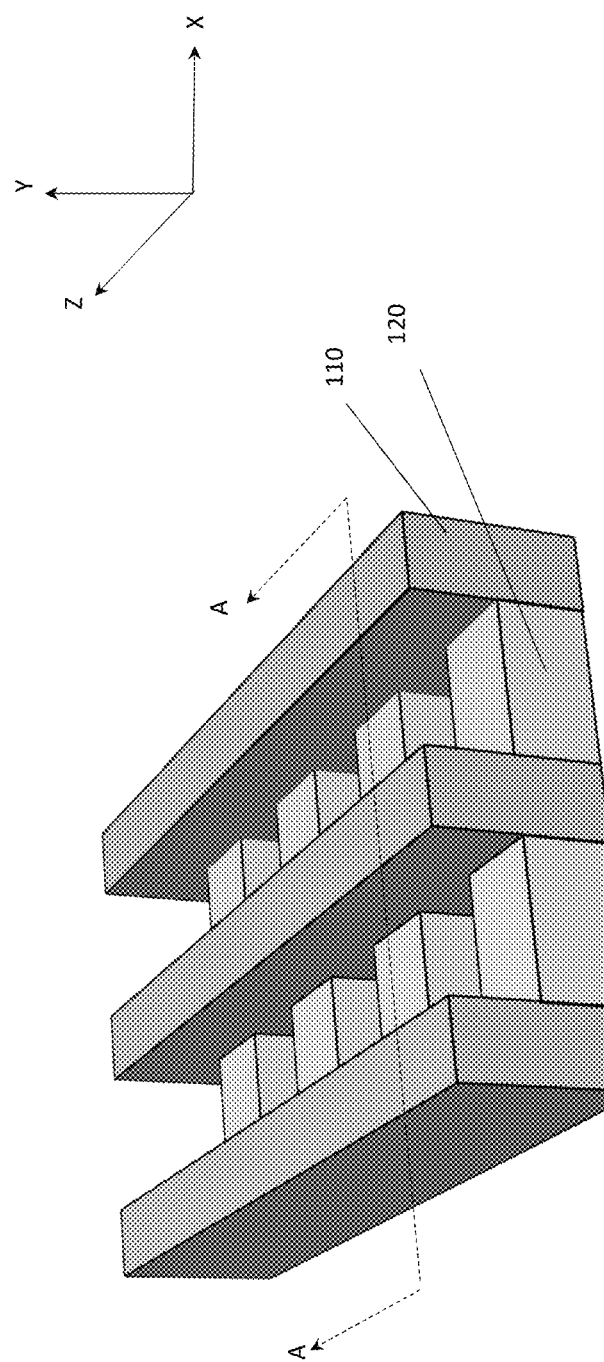
FIG. 1 is a tilted (or three-dimensional) view that depicts a simplified illustration of a device structure in which high aspect ratio fins have been stabilized with silicon crossbars for support according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). Moreover, the various tasks and process steps described herein can be incorporated into a more comprehensive procedure or process having additional steps or functionality not described in detail herein.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Although this description includes the fabrication operations and resulting structures for specific types of nonplanar FETs, implementation of the teachings recited herein are not limited to a particular type of FET or IC architecture. Rather embodiments of the present invention are capable of being implemented in conjunction with any other type of nonplanar FET or IC architecture, now known or later developed.

Turning now to a more detailed description of technologies that are more specifically relevant to aspects of the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Semiconductor devices are typically formed using active regions of a wafer. In an integrated circuit (IC) having a plurality of metal oxide semiconductor field effect transistors (MOSFETs), each MOSFET has a source and a drain that are formed in an active region of a semiconductor layer by incorporating n-type or p-type impurities in the layer of semiconductor material. MOSFETs device geometries can be categorized as planar or nonplanar. In planar MOSFETs, the various parts of the MOSFET device are laid down as planes or layers. In nonplanar MOSFETs, the various parts of the MOSFET device are three-dimensional (3D) structures having height, length, and width dimension.

A fin-type FET (FinFET) is an example of a nonplanar MOSFET that has as a main feature an elongated fin-shaped element. The gate is wrapped around a central portion of the fin. The portion of the fin that is under the gate functions as the channel. The portions of the fin that are not under the gate function as the source or the drain (S/D), respectively. The thickness of the fin determines an effective channel length of the device.

Another example of a nonplanar MOSFET is a vertical FET (VFET), which, like the FinFET, employs a semiconductor fin. In VFETs, side-gates wrap around the perimeter of the fin. The side-gates can be contacted outside the active region, resulting in increased device density and some increased performance over lateral devices. In VFETs the source to drain current flows in a direction that is perpendicular to a major surface of the substrate. For example, in a known VFET configuration a major substrate surface is horizontal and a vertical fin extends upward from the substrate surface. The fin forms the channel region of the transistor. A source region and a drain region are situated in electrical contact with the top and bottom ends of the channel region, while a gate is disposed on one or more of the fin sidewalls.

The fins used in nonplanar transistors such as FinFETs and VFETs are often high aspect ratio structures. For example, the fins used in FinFET and VFET devices and be about 100 nm high and about 8 nm wide. High aspect ratio fins formed from silicon germanium SiGe exhibit more wiggle than high aspect ratio fins formed from silicon Si. The possible explanations for this difference include that Si and SiGe have very different mechanical properties resulting in different line edge roughness ("LER"), the reactive-ion-etch used to form the fin impacts Si differently than SiGe, and there is intrinsic stress in fins formed from SiGe. Thus, wiggling can be caused by a combination of factors including weak mechanical properties, high aspect ratio fins, and use of a wet process. Fin aspect ratio cannot be changed for isolation and electrical performance reasons, and wet cleaning is necessary Turning now to an overview of aspects of the invention, one or more embodiments of the invention address the above-described shortcomings of the prior art by providing methods and structures to reduce wiggling in semiconductor fins. The process applies to both Si fins and SiGe fins. In embodiments of the invention, the semiconductor fins are formed in a bulk silicon (Si) substrate using a two-stage fin etch process. In the first stage, the bulk Si substrate is etched to a first level creating an initial or top fin structure having an initial/top fin height dimension. In embodiments of the invention, the initial/top fin height is selected to be a fin height that will be less susceptible to bending during the first stage of the two-stage fin etch process. In embodiments of the invention, the initial/top fin height is commensurate with the required fin height of the active region of the final fin structure. In embodiments of the invention, the initial/top fin height dimension is approximately ⅓ of the final fin height.

The second stage of the two-stage fin etch process is used to form two structures, namely a bottom fin structure and a crossbar. In embodiments of the invention, the bottom fin structure and the crossbar are integral and formed in the remaining portion of the bulk Si substrate below the initial/top fin structure. In embodiments of the invention, the bottom fin structure and the crossbar are formed using a directed self-assembly process that leverages the self-assembly characteristics of block copolymer materials. In embodiments of the invention, fin stabilizer elements in the form of crossbars are positioned between adjacent fins to stabilize the fins. In embodiments of the invention, the crossbars are Si and are created in shallow trench isolation (STI) regions during fin RIE to provide additional support for the fins, thus further enhancing the mechanical properties. In embodiments of the invention, oxidation of the stabilizing crossbars will turn the Si crossbars into part of the STI. This provides additional benefits in that it can compensate for volume change during STI densification and can prevent STI voids. Methods for forming a semiconductor structure and semiconductor structures in accordance with embodiments of the invention are described in detail below by referring to the accompanying drawings in FIGS. 1-12.

Turning now to a more detailed description of aspects of the present invention, FIG. 1 is a tilted (or three-dimensional) view that depicts a simplified illustration of a device structure in which high aspect ratio fins 110 have been stabilized with silicon crossbars 120 for support according to embodiments of the invention. In embodiments of the invention the crossbars 120 are Si, but other materials with sufficient strength to stabilize the fins from wiggling during fabrication could be used. Si is convenient because the crossbars are formed in the bulk silicon substrate. For ease of illustration, the hard mask that was used to pattern and form the fins 110 is not shown in FIG. 1. Also, for ease of illustration, the bottom Si substrate that supports the fins 110 and the crossbars 120 is not shown in FIG. 1. As previously described herein, the crossbars 120 provide additional support for the fins 110, thereby reducing LER and wiggling. Because the Si crossbars 120 will, through subsequent fabrication operations, become part of an STI region (not shown), the crossbars can referred to as "sacrificial" crossbars or intermediate structures.

FIGS. 2-12 illustrate methods for forming the fins 110 and Si crossbars 120 shown in FIG. 1 using a two-stage fin etch process according to embodiments of the invention. More specifically, FIG. 1 depicts a simplified three-dimensional view of a semiconductor structure having crossbar reinforced fins 110 in accordance with aspects of the invention, and FIGS. 2-12 depict fabrication details for forming a semiconductor structure of the type shown in FIG. 1. The semiconductor device structures shown in FIGS. 2-12 depict fabrication operations for forming a semiconductor device that is substantially the same as the semiconductor structure shown in FIG. 1 but with more fabrication details and structural details. The semiconductor structures shown in FIGS. 2-12 depict cross-sectional views that are taken along line A-A shown in FIG. 1.

Figure 2:
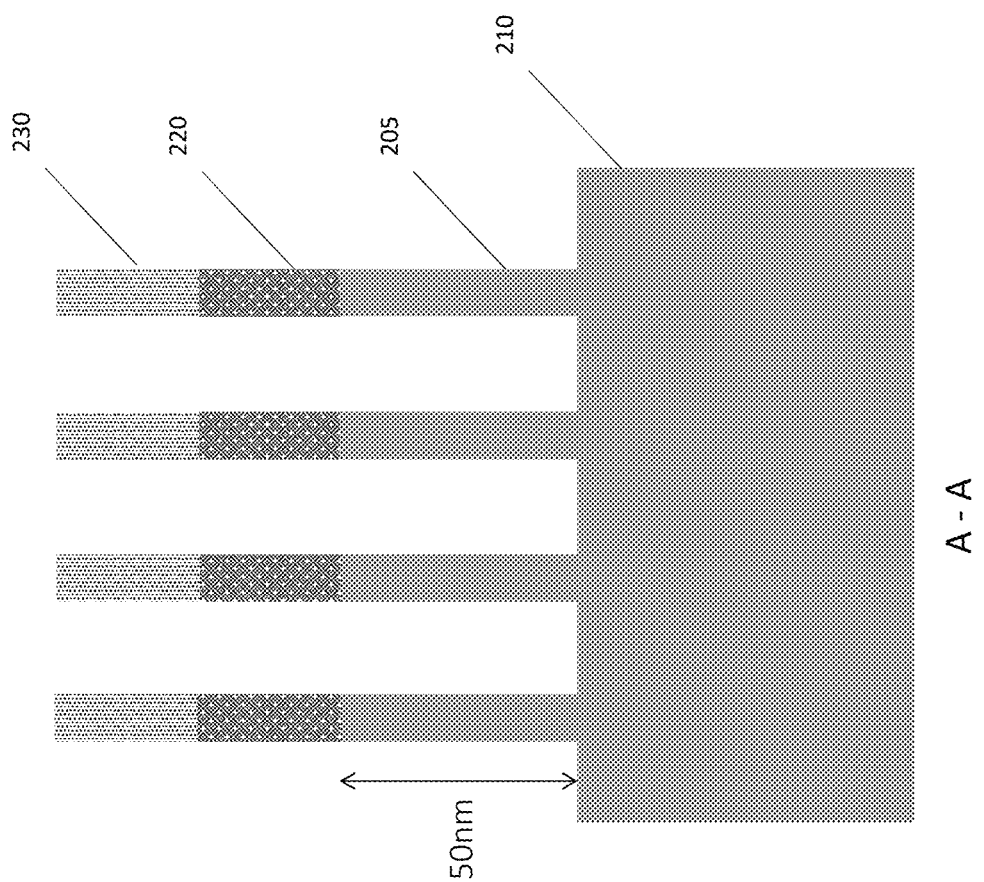
FIG. 2 depicts a cross-sectional view of a semiconductor structure after a processing operation according to one or more embodiments of the present invention.

FIG. 2 depicts a cross-sectional view of a semiconductor structure after various processing operations according to one or more embodiments of the present invention. More specifically, FIG. 2 depicts the semiconductor structure after application of the first stage of a two-stage fin etch process according to embodiments of the invention. The semiconductor structure depicted in FIG. 2 includes a substrate 210, top fins 205, a silicon nitride (SiN) hardmask 220, and an oxide hardmask 230, configured and arranged as shown. The semiconductor structure shown in FIG. 2 can be fabricated by depositing a SiN hardmask layer over bulk Si material followed by a typical self-aligned double/quadruple patterning (SADP/SAQP) to form the fin patterns made of oxide. The fin pattern is then transferred to the SiN hardmask layer by plasma etching, thereby forming the SiN hardmask 220 and the oxide hardmask 230. Following formation of the SiN hardmask 220 and the oxide hardmask 230, the bulk silicon material is etched using, for example, a reactive ion etch (RIE) process, to form the top fins 205 and the silicon substrate 210. The above-described hardmask layers can be formed utilizing a deposition process such as, for example, CVD, PECVD, ALD, chemical solution deposition, and/or evaporation. In some embodiments of the invention, the hardmask layers can be formed by a thermal process such as, for example, oxidation or nitridation. Any combination of the above mentioned processes can also be used in forming the hardmask layers. In an exemplary embodiment of the invention, assuming that the fins 205 have a pitch of approximately 30 nm and a width W taken along the X-axis of approximately 10 nm, the bulk silicon material is etched about 50 nm to form the fins 205 and the silicon substrate 210. In embodiments of the invention, the width W of the fin 205 can be referred to as the critical dimension ("CD"). The above dimensions are exemplary only, and those skilled in the art after reading this detailed description will appreciate that other dimensions are possible.

In accordance with embodiments of the invention, in the first stage of the two-stage fin etch process, the top fin 205 has an initial/top fin height dimension selected to be a fin height that will be less susceptible to bending during the first stage of the two-stage fin etch process. In embodiments of the invention, the initial/top height of the top fin 205 is commensurate with the required fin height of the active region of the final fin structure 1020 (show in FIG. 10). In embodiments of the invention, the initial/top fin height dimension of the top fin 205 is approximately ½ to ⅓ of the final height of the final fin structure 1020.

Figure 3:
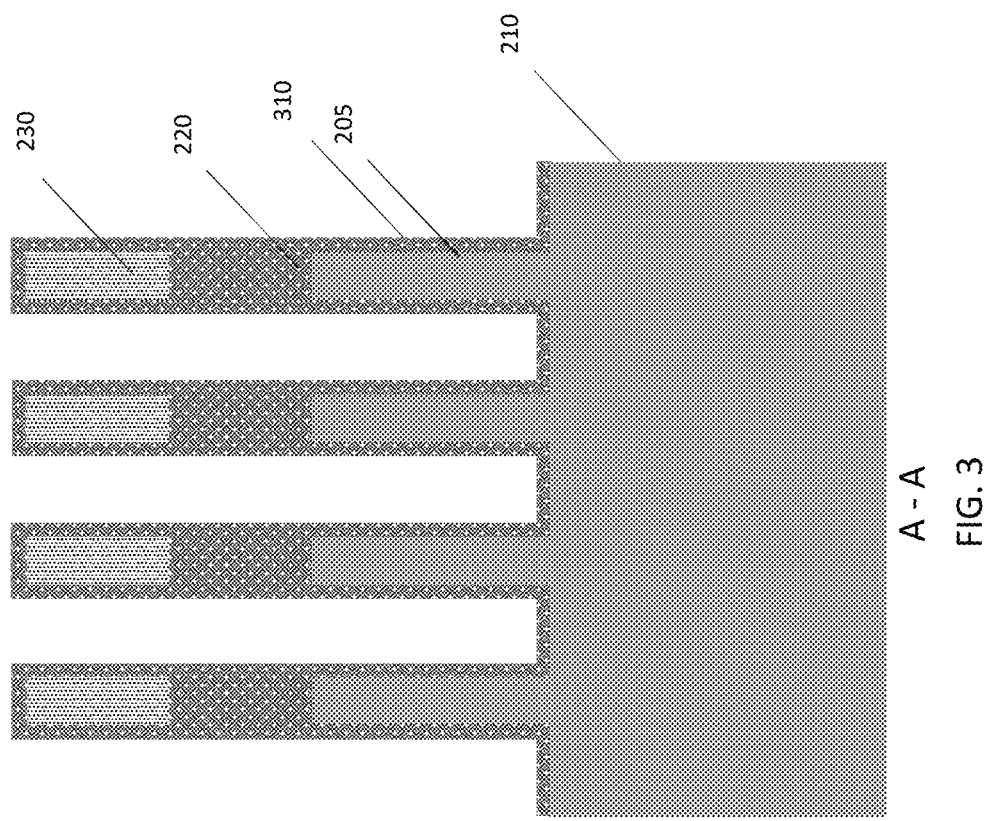
FIG. 3 depicts a cross-sectional view of a semiconductor structure after a processing operation according to one or more embodiments of the present invention.

FIG. 3 depicts a cross-sectional view of a semiconductor structure after a processing operation according to one or more embodiments of the present invention. A SiN liner 310 is deposited on exposed surfaces of the substrate 210, the fins 205, the SiN hardmask 220, and the oxide. The SiN liner 310 is to prevent the fins 205 from oxidizing during later fabrication processes. The SiN liner 310 can be deposited using any suitable deposition process. In embodiments of the invention, the SiN liner 310 is conformally deposited. In general deposition in semiconductor fabrication can be accomplished by a variety of processes that grow, coat, or otherwise transfer one material onto another. Suitable deposition technologies include but are not limited to physical vapor deposition, chemical vapor deposition, electrochemical deposition, molecular beam epitaxy, and more recently, atomic layer deposition.

FIGS. 4-10 depict views of a semiconductor structure after application of a second stage of the two-stage fin etch process in accordance with aspects of the invention. More specifically, FIGS. 4-10 depict the application of a novel directed self-assembly (DSA) process to form crossbar reinforced fins 1020 (shown in FIG. 10). The DSA processes used in accordance with aspects of the invention integrates self-assembling materials with traditional manufacturing processes. DSA takes advantage of the self-assembling properties of materials to reach nanoscale dimensions and, at the same time, meet the constraints of manufacturing. DSA is a "complimentary" technology in that it enables current manufacturing process capabilities to be enhanced and augmented, providing pathways for true nano-manufacturing at a drastically reduced cost. DSA is an alternative patterning technology that enables frequency multiplication through the use of block copolymers. In general, a block copolymer is a copolymer made up of homogenous blocks of different polymerized monomers. For example, PS-b-PMMA stands for polystyrene-block-poly(methyl methacrylate) and is made by first polymerizing styrene, and then subsequently polymerizing MMA from the reactive end of the polystyrene chains. If the monomers are chemically incompatible (i.e., they don't like to mix), the block copolymer can exhibit microphase separation in which the incompatible monomers arrange themselves in a repeating pattern have a defined pitch or period (known as $L_O$) related to the molecular weight of the block copolymer. In the prior example, PS is nonpolar and PMMA is polar so they don't like to mix and under the appropriate circumstances (e.g., adding energy through heat) will exhibit microphase separation. When used in conjunction with an appropriate pre-pattern that directs the orientation for self-assembled structures, DSA can create fine features beyond lithography resolution limit. As describes subsequently herein, the self-assembly used in connection with aspects of the invention is targeted at a bottom region of trenches 620 (shown in FIG. 6) to provide no or very little overburden. Due to the width dimension of the trench, which is a critical dimension, being about 20 nm in an exemplary embodiment of the invention, it is easier to process and control the DSA structures described herein to be in a perpendicular orientation to the Si fins 205, as reported by Han et al, Adv. Mater. 2010, 22, 4325-4329. Brush chemical composition is the major variable used to control the orientation.

Figure 4:
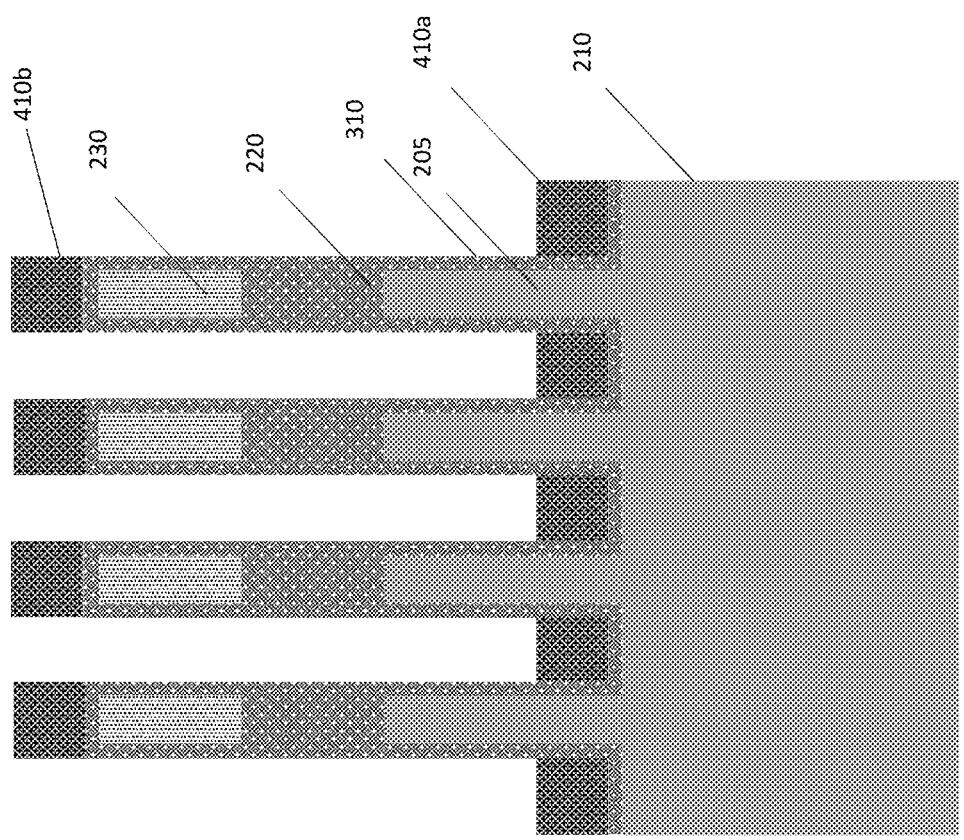
FIG. 4 depicts a cross-sectional view of a semiconductor structure after a processing operation according to one or more embodiments of the present invention.

As shown in FIG. 4, a bottom oxide region 410a and a top oxide region 410b has been formed by depositing a non-conformal oxide layer (not shown) using high density plasma (HDP) chemical vapor deposition (CVD), for example, in order to deposit more oxide at the bottom and the top of the fins 205 than on the sidewalls of the fins 205. The deposited HDP oxide layer is isotropically etched using a diluted hydrofluoric acid etch (dHF), for example, thereby forming the bottom oxide region 410a and the top oxide region 410b while removing all the oxide on the sidewall.

Figure 5:
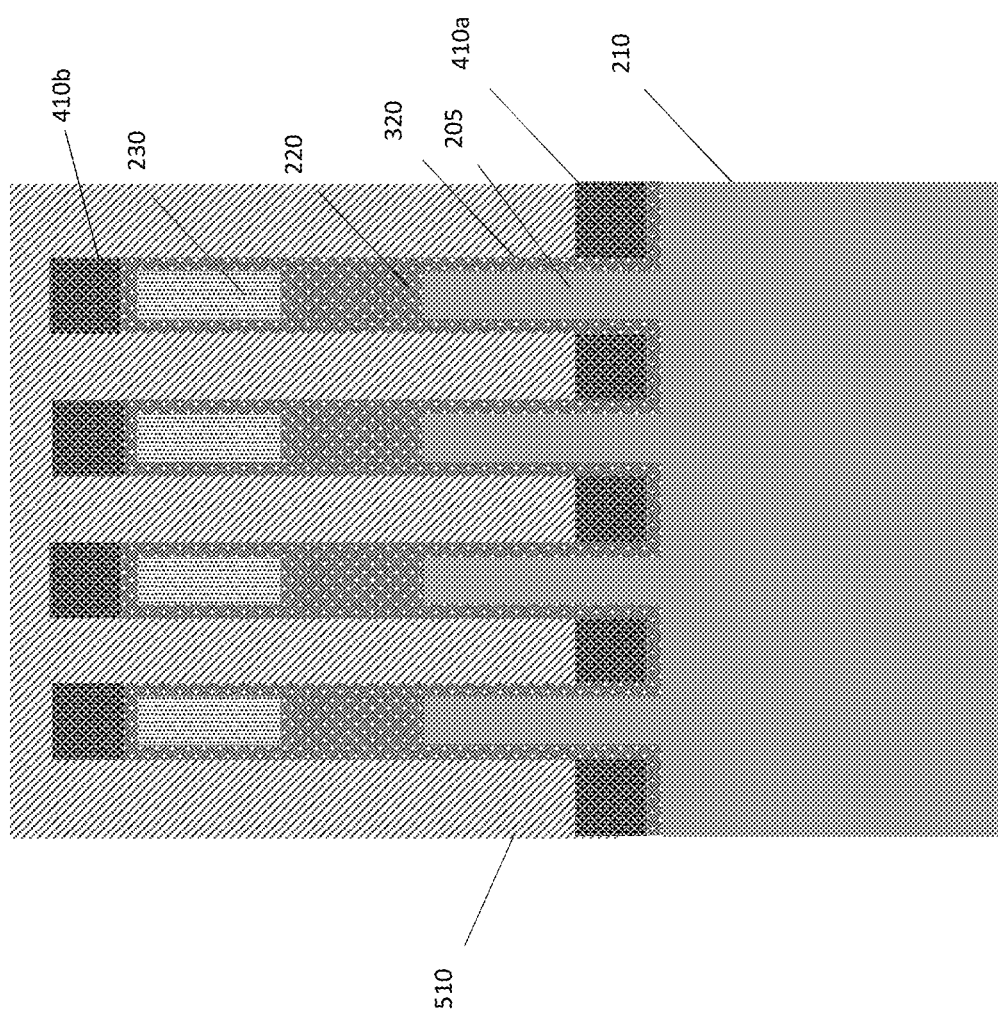
FIG. 5 depicts a cross-sectional view of a semiconductor structure after a processing operation according to one or more embodiments of the present invention.

FIG. 5 depicts a cross-sectional view of a semiconductor structure after a processing operation according to one or more embodiments of the present invention. A polymer brush material 510 is deposited over the semiconductor structure. The polymer brush material 510 is then baked at 100-200 degrees Celsius for approximately 2-30 minutes to carry out a self-limiting grafting reaction between the polymer brush material 510 and the portions of the semiconductor structure it covers. In general, the resulting thickness of the brush layer is a function of the process temperature and time, molecular weight, and grafting functional group of polymer brush material. In embodiments of the invention, the polymer brush material 510 is a random copolymer of MMA and styrene, i.e. poly(styrene-random-methyl methacrylate) while the ratio of the monomers can be controlled during polymer synthesis. In general, the function of the polymer brush material 510 is to form a coating that establishes the proper surface energy of the bottom and the sidewall region to facilitate and stabilize the perpendicular orientation of the self-assembled BCPs in later steps.

FIG. 6 depicts a cross-sectional view of a semiconductor structure after a processing operation according to one or more embodiments of the present invention. The ungrafted portions of the polymer brush mixture 510 (shown in FIG. 5) has been rinsed away to leave a brush coating 610 on the bottom oxide regions 410a, the SiN liner 310, and the top oxide regions 410b of the semiconductor structure. After removing the ungrafted portion of the polymer brush material 510, trenches 620 are formed in the space between the fins 205.

Figure 7A:
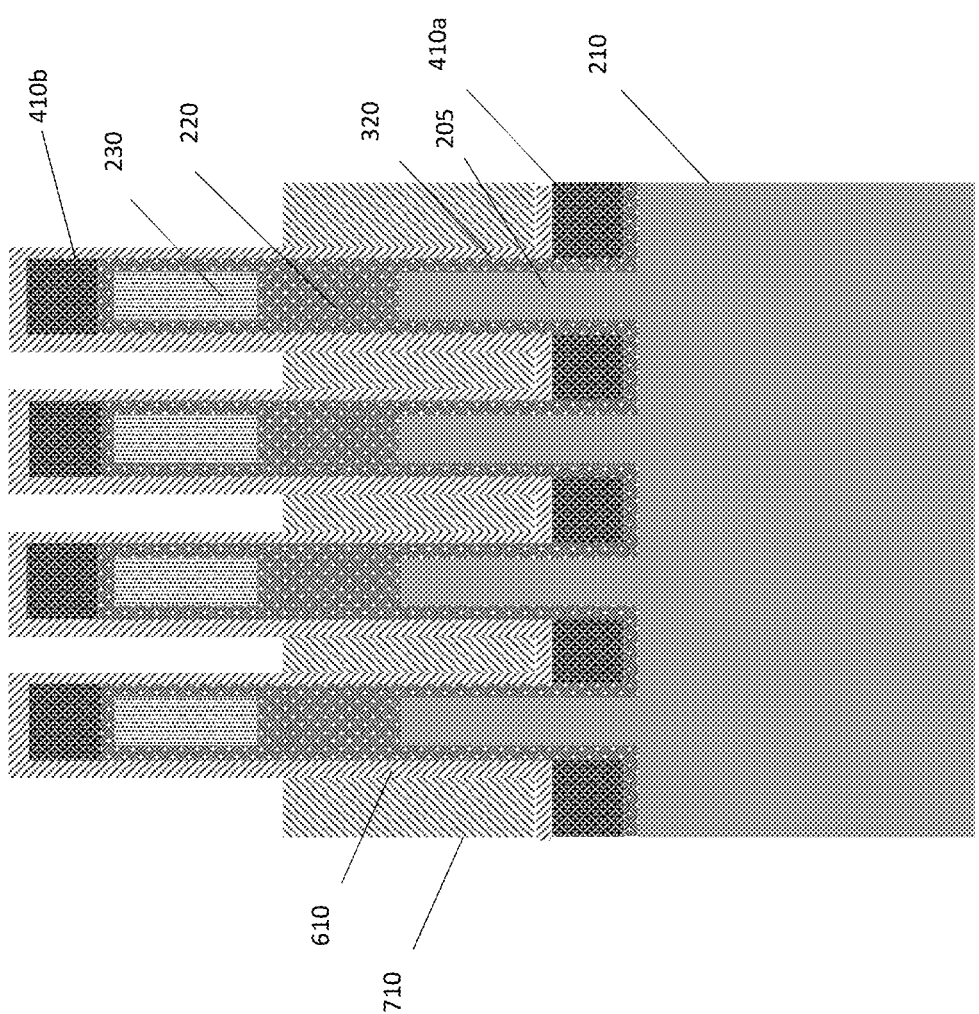
FIG. 7A depicts a cross-sectional view of a semiconductor structure after a processing operation according to one or more embodiments of the present invention
Figure 7B:
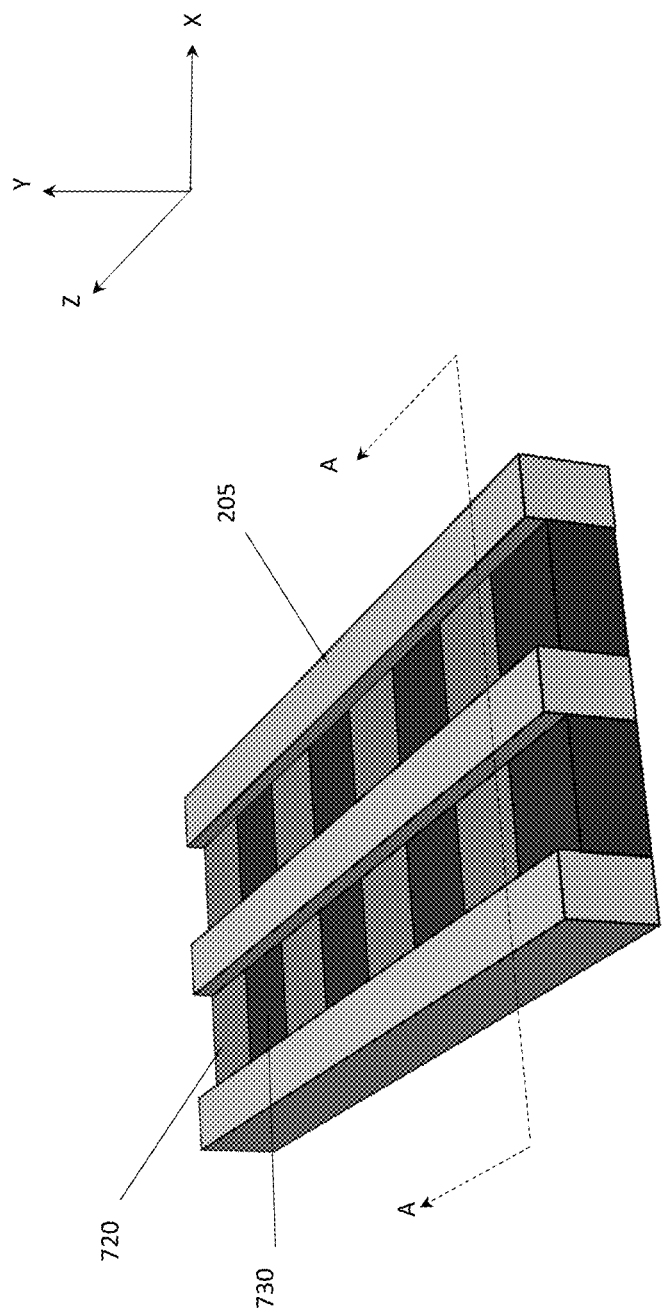
FIG. 7B is a tilted (or three-dimensional) view that depicts a simplified illustration of a portion of the semiconductor structure shown in FIG. 7A according to one or more embodiments of the present invention.

FIG. 7A depicts a cross-sectional view of a semiconductor structure after a processing operation according to one or more embodiments of the present invention, and FIG. 7B is a tilted (or three-dimensional) view that depicts a simplified illustration of a portion of the semiconductor structure shown in FIG. 7A. A block copolymer region 710 is deposited within the trenches 620 to form, within each of the trenches 620, a layered self-assembled structure. The block copolymer region 710 is made of lamella-forming PS-b-PMMA molecules, in which polystyrene block is ~50%. In an exemplary embodiment of the invention, the use of a random copolymer brush 610 with about 60% styrene gives the desired structure of the block copolymer region 710 which is perpendicular to the trenches 620. This is in contrast to brush composition with styrene content, for example, 47% and 78% that yield undesired structures that are parallel with the trenches 620. The styrene content should be greater than 47% and less than 78%. The block copolymer region 710 exhibits microphase separation, which is best illustrated by the simplified diagram of the semiconductor structure shown in FIG. 7B. As shown in FIG. 7B, the block copolymer region 710 self-assembles into alternating bands or microdomains of PMMA structures 720 followed by bands or microdomains of PS structures 730.

Figure 8A:
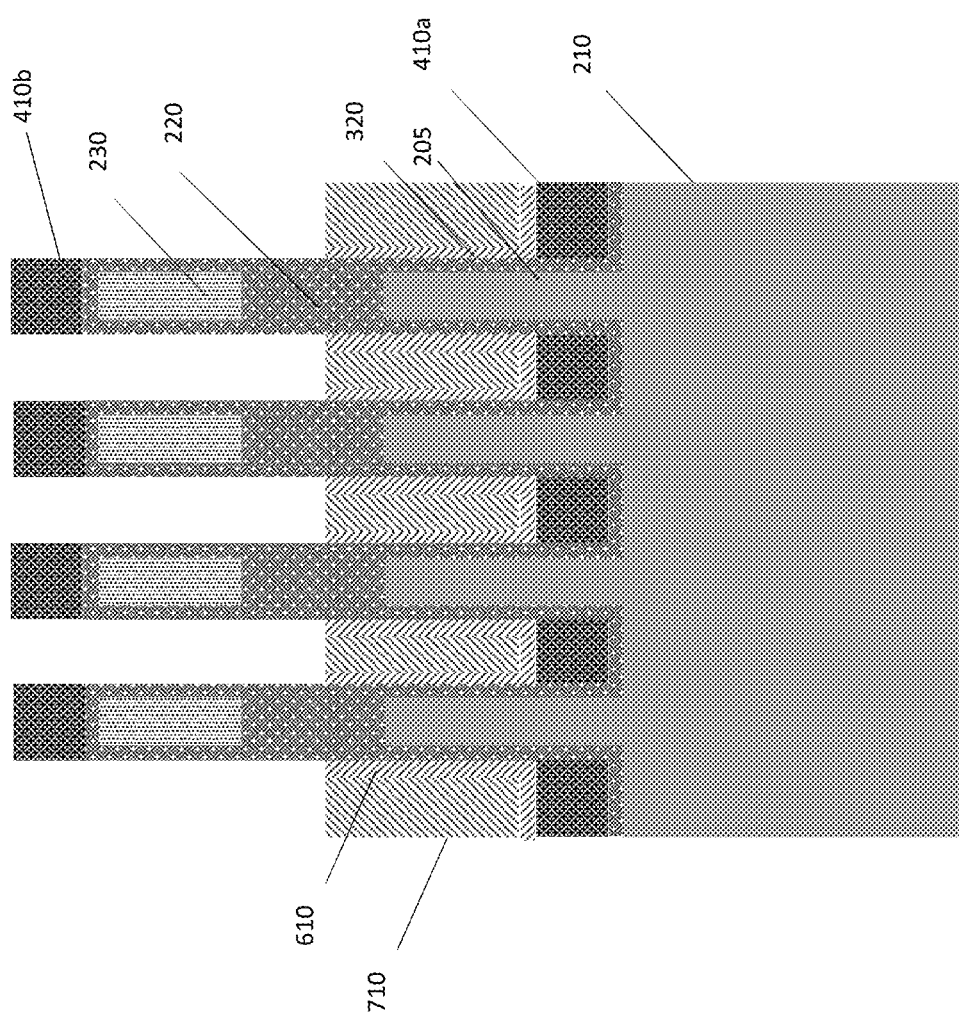
FIG. 8A depicts a cross-sectional view of a semiconductor structure after a processing operation according to one or more embodiments of the present invention
Figure 8B:
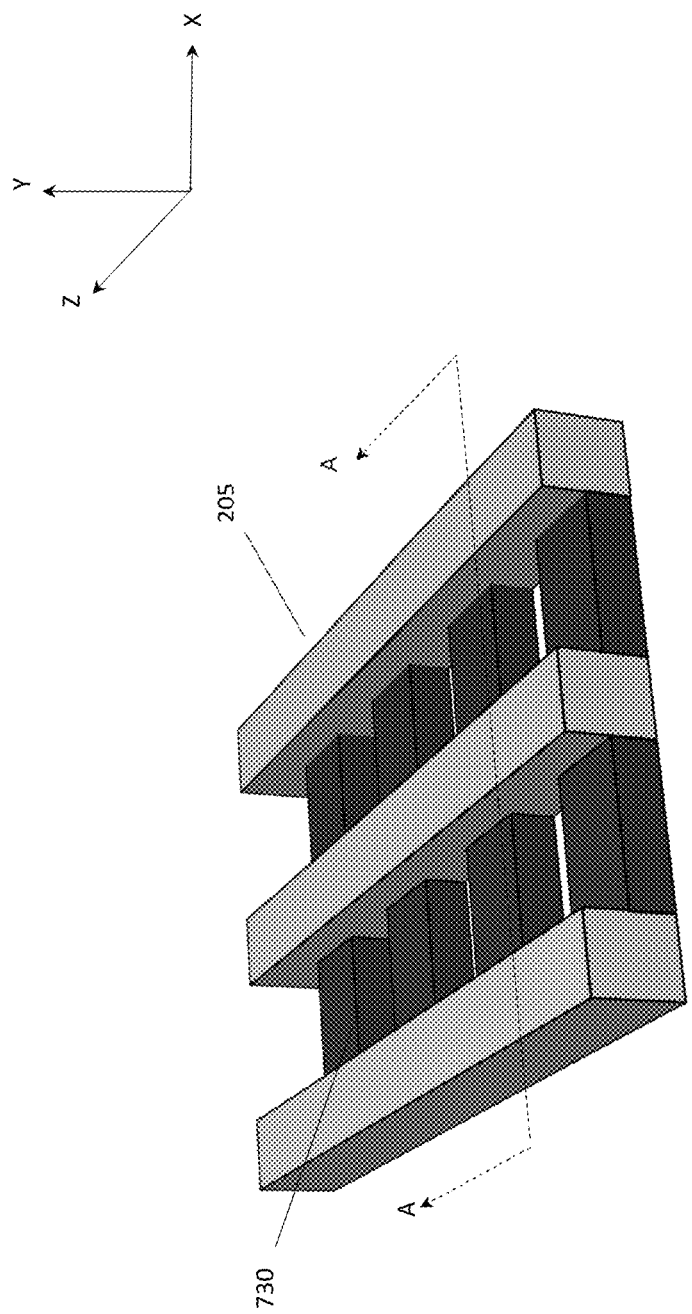
FIG. 8B is a tilted (or three-dimensional) view that depicts a simplified illustration of a portion of the semiconductor structure shown in FIG. 8A according to one or more embodiments of the present invention.

FIG. 8A depicts a cross-sectional view of a semiconductor structure after a processing operation according to one or more embodiments of the present invention, and FIG. 8B is a tilted (or three-dimensional) view that depicts a simplified illustration of a portion of the semiconductor structure shown in FIG. 8A. In this stage of the processing, the alternating PMMA blocks 720 have been removed through an oxygen-based plasma etching process, for example. PS domains 730 is partially etched but remain sufficient to serve as the etch mask for later oxide etch processes. As the brush coating 610 is composed of similar monomers to BCP 710, the exposed brush coating 610 has been removed as well, except where the brush coating 610 is underneath the PS blocks 730. Thus, following this stage in the process, the only structures in the trenches 620 that remain are spaced apart PS blocks 730.

Figure 9A:
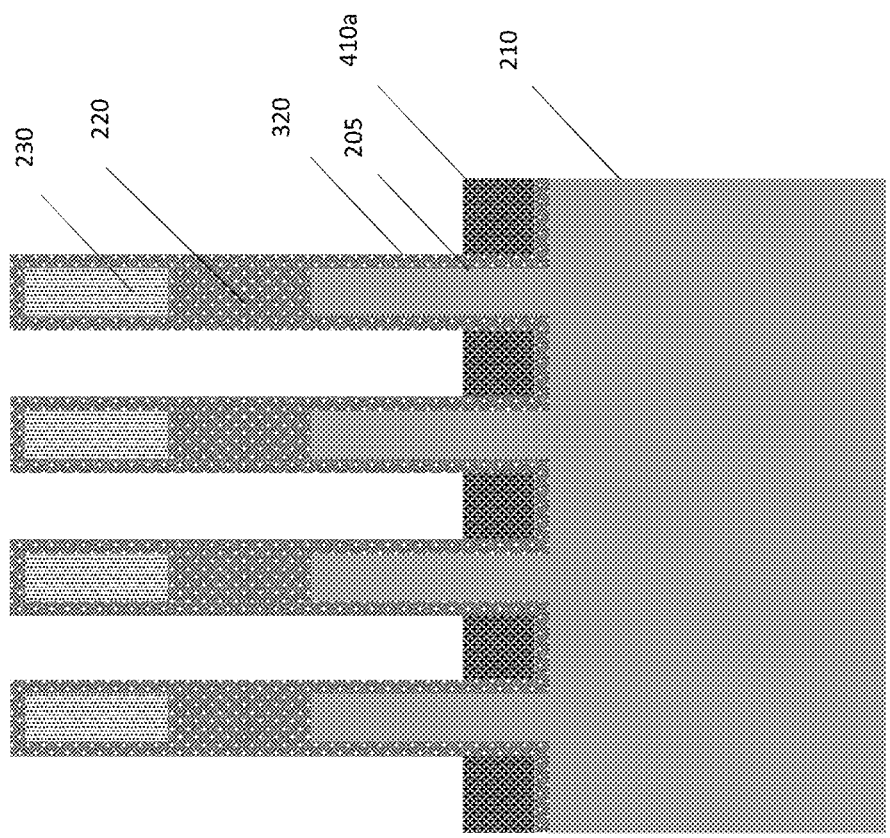
FIG. 9A depicts a cross-sectional view of a semiconductor structure after a processing operation according to one or more embodiments of the present invention
Figure 9B:
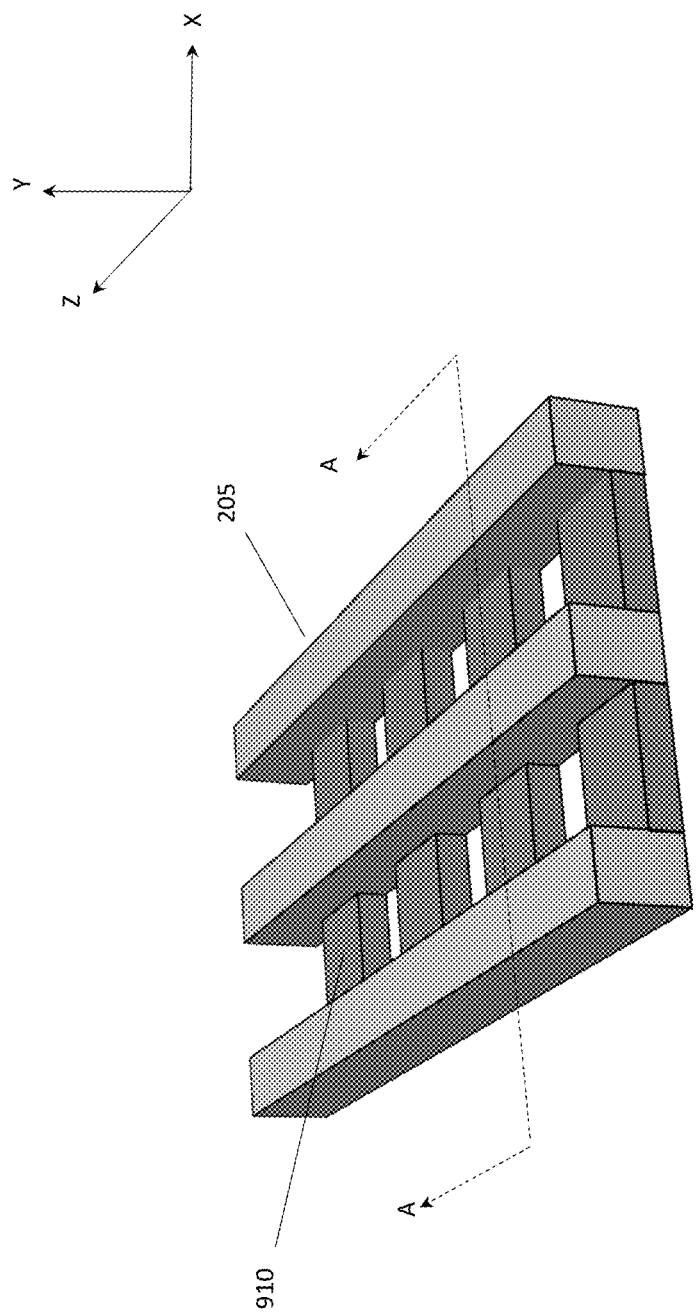
FIG. 9B is a tilted (or three-dimensional) view that depicts a simplified illustration of a portion of the semiconductor structure shown in FIG. 9A according to one or more embodiments of the present invention.

FIG. 9A depicts a cross-sectional view of a semiconductor structure after a processing operation according to one or more embodiments of the present invention, and FIG. 9B is a tilted (or three-dimensional) view that depicts a simplified illustration of a portion of the semiconductor structure shown in FIG. 9A. An HDP oxide etch is next performed using polystyrene as a mask/template. The top HDP oxide region 410b on top of the hardmask 230 is consumed due to the lack of a mask, and the bottom HDP oxide regions 410a remain, which are now in the shape of crossbars. After the etching, if there is any polystyrene left, an oxygen plasma or wet clean can be used to remove the polymer. This last step is optional because the following Si etch step will further consume all the polystyrene and part of the HDP oxide.

Figure 10B:
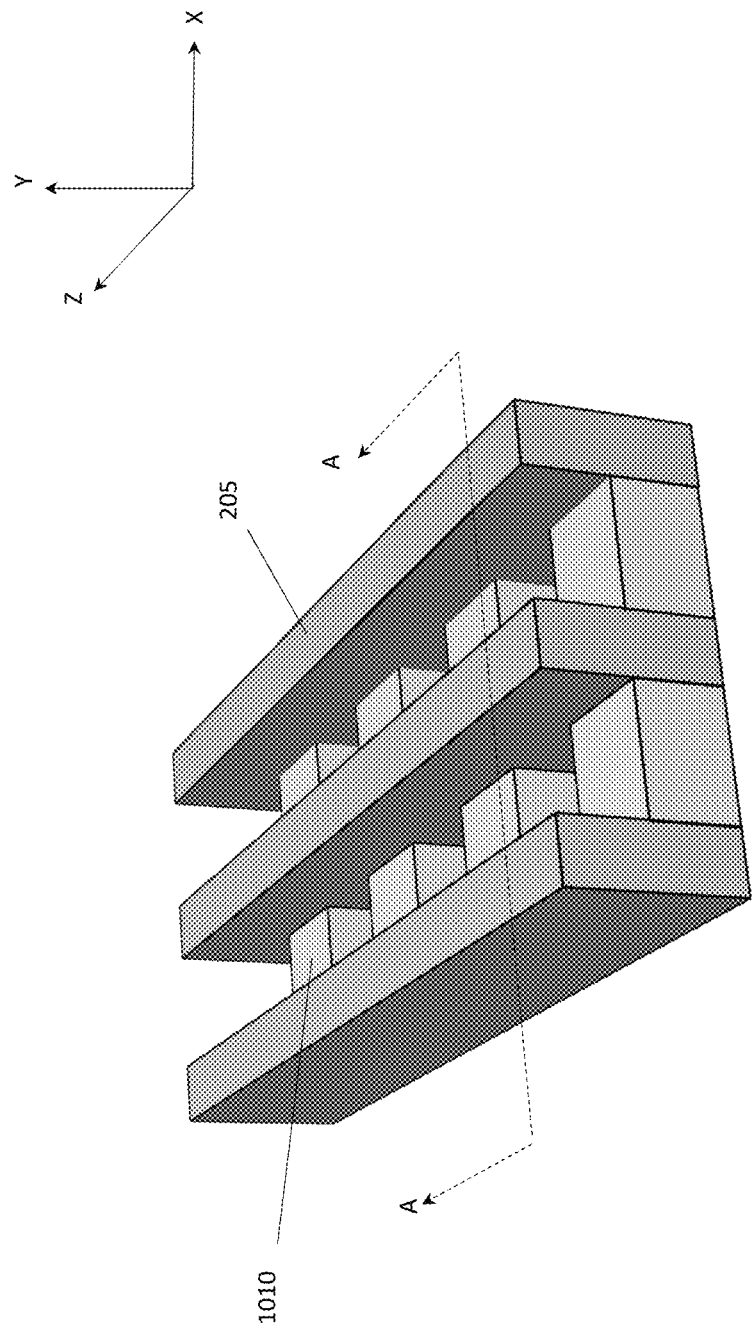
FIG. 10B is a tilted (or three-dimensional) view that depicts a simplified illustration of a portion of the semiconductor structure shown in FIG. 10A according to one or more embodiments of the present invention.

FIG. 10A depicts a cross-sectional view of a semiconductor structure after a processing operation according to one or more embodiments of the present invention, and FIG. 10B is a tilted (or three-dimensional) view that depicts a simplified illustration of a portion of the semiconductor structure shown in FIG. 10A. The next stage is to finish the Si RIE. The remaining oxide hardmask is removed and Si crossbars 1010 remain. A Si etch is performed using HDP oxide as the mask/template. Some of the HDP mask in the trench will be consumed, and at the same time, as will some oxide on the top of the fin 205. After Si etch, diluted HF (dHF) removes the remaining HDP oxide and the exposed oxide on top of the fin 205. dHF will not erode SiN so the structure shown only has SiN on the top of the fins but no oxide remains.

FIG. 11 depicts a cross-sectional view of a semiconductor structure after a processing operation according to one or more embodiments of the present invention. An optional implantation stage is next performed. Implantation of oxygen or other elements is done to damage the crystalline Si crossbars and partially converting the crystalline Si crossbars to polycrystalline or amorphous Si crossbars 1010. This stage facilitates a later oxidation stage.

FIG. 12 depicts a cross-sectional view of a semiconductor structure after a processing operation according to one or more embodiments of the present invention. An STI fill and oxidation process is the next stage. STI is filled by a flowable oxide and then a UV or thermal cure to provide a less dense STI oxide 1220. A denser thermal oxide, or silicon oxide, 1210 is formed from either the damaged amorphous Si or an undamaged crystalline Si. Further standard processing stages continue after this point to form a complete transistor having a channel region, a source region, a drain region and a gate. The specifics of the standard processing stages will depend on the architecture of the final transistors. For example, the processing stages for forming a FinFET will be different from the processing stages for forming a VFET. These standard processing stages are well-known and so, in the interest of brevity, such conventional steps have been omitted.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can be understood to include any integer number greater than or equal to one, i.e. one, two, three, four, etc. The terms "a plurality" can be understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor structure, the method comprising:
   forming at least two semiconductor fins on a substrate;
   forming a monolayer of polymer brush material over the fins and the substrate;
   applying a block copolymer comprising a first polymer and a second polymer in between the fins, such that the first polymer and second polymer self-assemble into a plurality of interleaved first microdomains and second microdomains perpendicular to and within a trench between the fins, the first microdomains comprising the first polymer and the second microdomains comprising the second polymer; and
   removing the second microdomains.

2. The method of claim 1, wherein the first polymer is polystyrene and the second polymer is poly(methyl methacrylate) (PMMA).

3. The method of claim 1, wherein the polymer brush has about 60% of styrene content and the block copolymer is lamella-forming with about 50% of polystyrene.

4. The method of claim 1 further comprising applying a silicon nitride liner over the first fins prior to forming the polymer brush material.

5. The method of claim 4 further comprising depositing an oxide over the silicon nitride liner at the bottom of the trench and the top of the fins.

6. The method of claim 1 further comprising, after removing the second microdomains, etching the oxide and silicon nitride liner to expose the bottom of the silicon trench.

7. The method of claim 6 further comprising etching the silicon crossbars and selectively removing the oxide template at the bottom of the trench to expose silicon crossbars.

8. The method of claim 7 further comprising implanting material in the exposed silicon crossbars to damage the exposed silicon crossbars.

9. The method of claim 8, wherein the exposed silicon crossbars are partially converted from crystalline silicon to polycrystalline or amorphous silicon.

10. The method of claim 7 further comprising oxidizing the exposed silicon crossbars into thermal oxide.

11. The method of claim 10, wherein oxidizing occurs through an annealing process.

12. The method of claim 7 further comprising performing a shallow trench isolation (STI) fill between the fins by flowable oxide before the oxidation.

13. The method of claim 12 further comprising performing a thermal cure.

14. A method for forming a semiconductor structure, the method comprising:
   forming at least two semiconductor fins on a substrate;
   forming a monolayer of polymer brush material over the fins and the substrate;
   applying a block copolymer comprising a first polymer and a second polymer in between the fins, such that the first polymer and second polymer self-assemble into a plurality of interleaved first microdomains and second microdomains perpendicular to and within a trench between the fins, the first microdomains comprising the first polymer and the second microdomains comprising the second polymer; and
   removing the second microdomains, wherein the polymer brush is greater than about 47% and less than about 78% of styrene content and the block copolymer is lamella-forming with about 50% of polystyrene.

* * * * *